United States Patent [19]
Larkins

[11] Patent Number: 4,532,557
[45] Date of Patent: Jul. 30, 1985

[54] SYNCHRONOUS PROGRAMMABLE PARALLEL-TO-SERIAL DATA CONVERTER AND A PROGRAMMABLE LONGITUDINAL TIME CODE GENERATOR UTILIZING THE CONVERTER

[75] Inventor: David N. Larkins, Palo Alto, Calif.

[73] Assignee: Ampex Corporation, Redwood City, Calif.

[21] Appl. No.: 483,326

[22] Filed: Apr. 8, 1983

[51] Int. Cl.$^3$ .................. G11B 5/06; G11B 27/14; H04N 5/78

[52] U.S. Cl. .................... 360/33.1; 358/147; 360/14.3; 360/49; 360/72.2

[58] Field of Search ............ 360/49, 33.1, 10.1, 360/10.2, 10.3, 14.2, 14.3, 72.2, 74.4; 377/76, 80, 64, 78; 340/870.14; 358/147

[56] References Cited

U.S. PATENT DOCUMENTS

| | | | |
|---|---|---|---|
| 3,681,524 | 8/1972 | Nicholls | 360/72.2 |
| 4,134,130 | 1/1979 | Tachi | 358/147 |
| 4,159,480 | 6/1979 | Tachi | 358/147 |

OTHER PUBLICATIONS

Geise, Heinz Dieter; The Use of Microcomputers and Microprocessors in Modern VTR Control; Feb. 2, 1979; SMPTE Journal, Dec. 1979, pp. 831–834.

*Primary Examiner*—Raymond F. Cardillo, Jr.
*Assistant Examiner*—Alan K. Aldous
*Attorney, Agent, or Firm*—Elizabeth E. Strnad; Joel D. Talcott

[57] ABSTRACT

A programmable time code generator utilizes a synchronous parallel-to-serial data converter for conversion of time code in parallel form into serial form. The resulting longitudinal time code is suitable for recording on magnetic tape in synchronism with an information signal. The time code generator can be readily adapted for various video recording formats, such as NTSC, PAL, PAL-M, SECAM, etc., as well as for synchronous time code generation in other types of recording. In addition, the frequency of the generated longitudinal time code can be changed in a simple manner to be adapted for recording at various tape speeds which are different from the normal playback speed.

4 Claims, 7 Drawing Figures

FIG_1

FIG_2

FIG.4

FIG_5A

FIG_5B

FIG_5C

SYNCHRONOUS PROGRAMMABLE PARALLEL-TO-SERIAL DATA CONVERTER AND A PROGRAMMABLE LONGITUDINAL TIME CODE GENERATOR UTILIZING THE CONVERTER

BACKGROUND OF THE INVENTION

The invention relates to a synchronous programmable parallel-to-serial data converter having a programmable frequency ratio between a parallel input data and serial output data and to a programmable longitudinal time code generator utilizing the converter and which can be programmed for use in various magnetic recording systems and at selected tape speeds.

As well known in the art of magnetic recording and reproduction, a time code is generally recorded on the magnetic medium, for example tape, along with the information signal. The recorded time code is utilized to locate a portion of the recorded information if necessary for example for editing, video program production or other purposes. For example when providing broadcast quality video tape recording, generation and recording of a time code must conform to specific well defined standards. As it is well known these standards vary with different recording systems, such as NTSC, PAL, PAL-M, SECAM, etc.

It is well known to utilize for example a microprocessor to generate a time code in parallel form which then must be converted into serial data for recording on tape as a longitudinal time code. In video tape recording, such as utilizing a longitudinal, transverse or helical recording/reproducing format time code is known to be recorded as a longitudinal signal on an audio track by an audio transducer. As well known and in accordance with the above-indicated standards, the time code is measured as an arbritrary time of the day and it consists for all the above-indicated recording systems of 80 bits of which each group of 8-bits or a byte indicates among other values a particular value as follows: tens of hours; units of hours; tens of minutes; units of minutes; tens of seconds; units of seconds; tens of frames and units of frames, respectively. Consequently, when it is necessary to change the recording format or, alternatively, when it is desired to record the time code at slower or faster tape speed than normal playback speed, the parameters of the time code generation must be changed accordingly, to obtain synchronous recording thereof with the recorded information.

Prior art time code generators utilize relatively complex timing and pulse generating circuitry which cannot be readily modified to provide respective time codes adapted to the above-indicated changes of the recording parameters.

SUMMARY OF THE INVENTION

Accordingly, it is an object of the present invention to provide a relatively simple device and method for generating a time code which can be readily modified to conform to changes in the recording parameters.

It is a further object of the invention to provide a synchronous programmable parallel-to-serial data converter which may be utilized for synchronous conversion of parallel time code data into serial form in synchronism with the recorded information signal.

It is a particular object of the present invention to provide a time code generator which can be readily modified to obtain longitudinal time code for synchronous magnetic recording with an information signal recorded in NTSC, PAL, PAL-M, SECAM or other recording formats and at various speeds of magnetic media with respect to normal playback speed.

The foregoing and other objects, features and advantages of the present invention will be apparent from the following detailed description and accompanying drawings.

DETAILED DESCRIPTION

Figure 1:
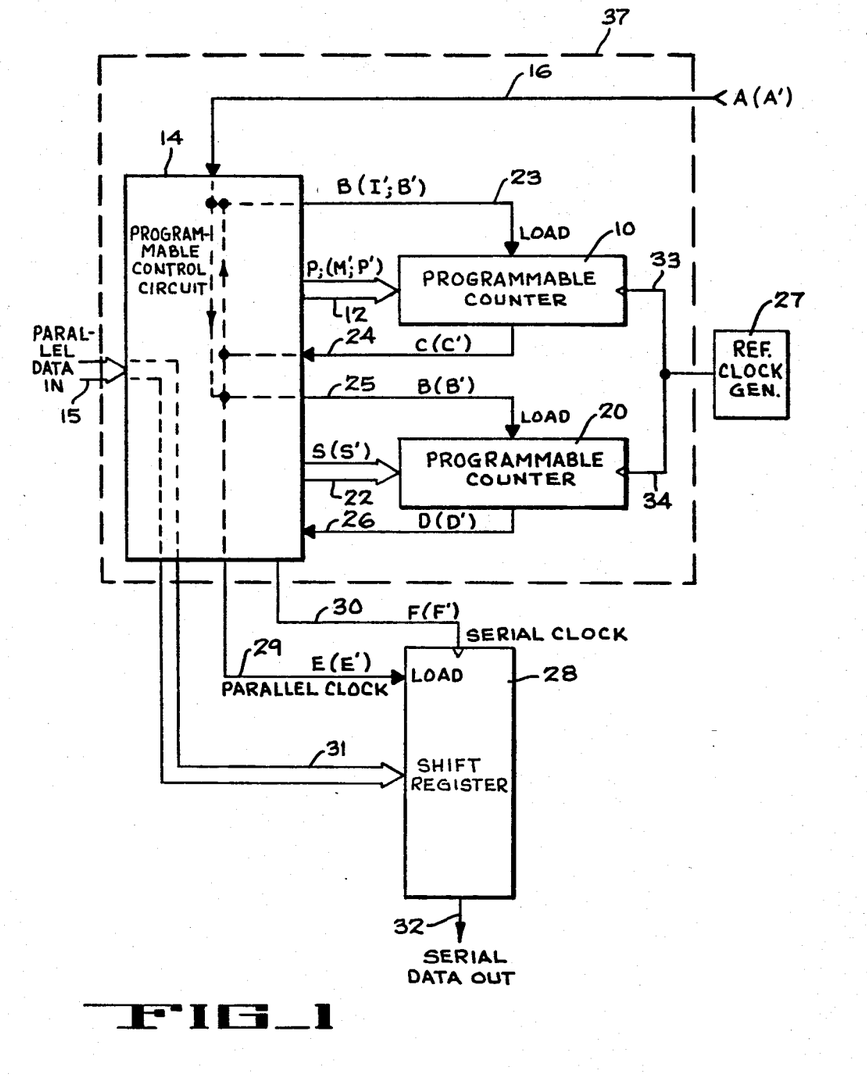
FIG. 1 is a simplified block diagram of a preferred embodiment of a synchronous programmable parallel-to-serial data converter circuit in accordance with the present invention.
Figure 3:
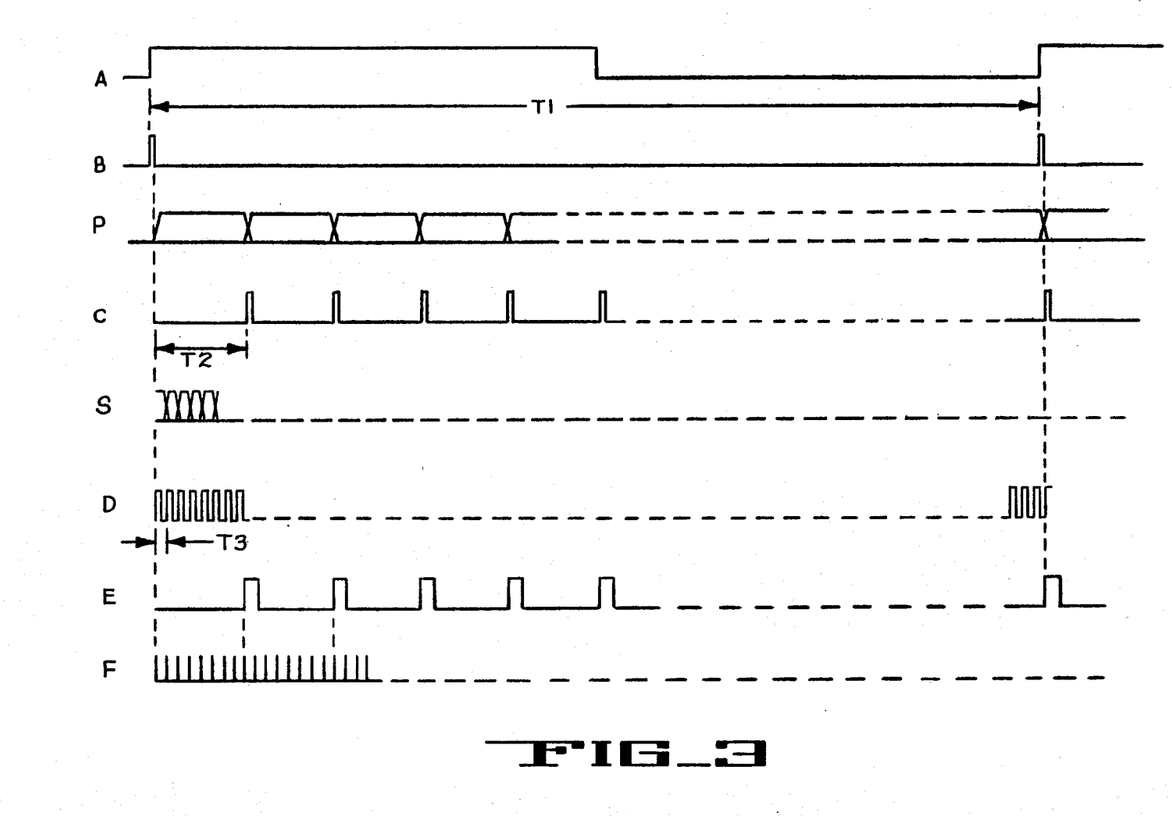
FIG. 3 shows timing diagrams illustrating operation of the circuit of FIG. 1.

The preferred embodiment of the synchronous programmable parallel-to-serial data converter shown in the block diagram of FIG. 1 will be now described, followed by a description of the operation thereof with reference to the timing diagrams of FIG. 3.

FIG. 1 shows a first programmable counter 10 which is connected by a parallel data line 12 to a programmable logic circuit 14. Circuit 14 has an input control line 16 for receiving a synchronization signal A from an outside source (not shown). A second programmable counter 20 is connected to circuit 14 by a parallel data line 22. The programmable counters 10, 20, are also connected to the programmable control logic circuit 14 by the respective control lines 23, 24; 25, 26; respectively, of which lines 23; 25 represent respective load control signals of counters 10; 20, while lines 24; 26 are respective output control signals from these counters as it will be described in more detail later.

The control circuit 14 receives a parallel data in the form of parallel data words via a data line 15 from an outside source (not shown). A parallel-to-serial data converter 28, implemented for example by a parallel-to-serial shift register receives that parallel data from the control circuit 14 via a parallel data line 31 and the resulting serial data is obtained therefrom on an output data line 32. The shift register 28 also receives a parallel data input or load control signal E from the logic circuit 14 via a control line 29 and a serial data shift control signal F via a control line 30.

Now the operation of the circuit of FIG. 1 will be described with reference to the timing diagrams of FIG. 3. The programmable control logic circuit 14 receives the synchronization pulse A via line 16 for example from an outside source (not shown), such as a microprocessor as it is well known in the art. Pulse A has a period T1 as depicted in FIG. 3. Circuit 14 provides in response thereto a load and reset control pulse B via lines 23 and 25 to reset the programmable counters 10, 20 to zero, respectively. Subsequently a binary number P representing a first integral count is loaded in parallel via data line 12 into counter 10 and a binary number S representing a second integral count is loaded in parallel via data line 22 into counter 20 to preset these respective counters. In the preferred embodiment numbers P, S are selected such that P is an integral multiple of S and both counters have the same clock signal frequency which is applied thereto from an external reference clock generator 27 in a well known manner. Counter 10 is preferably implemented as a retriggerable down counter which counts down from number P until it reaches zero and then it provides an output signal C on line 24 which re-starts counting by counter 10 from number P again. The second counter 20 is preferably a free running retriggerable counter which counts continuously at a frequency given by number S and the counter clock rate. The output signal on line 26 from counter 20 is shown at D in FIG. 4.

Thus a time interval T2 of output signal C on line 24 from counter 10 is determined by the number P loaded therein and the particular clock frequency utilized. Similarly, a time interval T3 of the output signal D of counter 20 is determined by the number S and the counter 20 clock frequency.

The programmable control circuit 14 of FIG. 1 receives a parallel data on line 15 from an external source, for example a microprocessor (not shown) as is well known in the art. Each parallel word which in the preferred embodiment is for example 8 bits long, is loaded in the shift register 28 synchronously with the load control signal E, also referred to as parallel clock signal which is derived from signal C by the control logic circuit 14 to obtain correct synchronization. Subsequently, shift register 28 receives the signal F on line 30 as a serial data output clock signal which determines the frequency at which the serial output data is shifted out from the shift register 28 on line 32. Similarly, the signal F, also referred to as a serial data shift signal is synchronously derived from the above-described output signal D on line 26 from the second programmable counter 20 by the programmable control logic circuit 14. It is noted that inherent delays occurring between the various signals due to system operation delays are not shown in the attached timing diagrams to simplify the description.

In addition to counter 20 being periodically retriggered by signal B, it is also periodically retriggered in response to signal C via lines 24 and 25 by the programmable control logic circuit 14 to obtain additional synchronization.

It is seen from the foregoing description that by selecting the numbers P and S such that at a known clock signal frequency provided by clock signal generator 27 respective desired time intervals T2, T3 may be obtained which have respective desired integral ratios with reference to the time interval T1 of the synchronization signal. It also follows from the foregoing disclosure that when the frequency of the serial data shift signal F is selected as an integral number multiple of the parallel clock signal E frequency, which number in turn corresponds to the number of bits in a parallel data word on line 31, then a synchronous parallel-to-serial data transfer will be obtained.

As it will follow from a more detailed description below, the aforementioned synchronous data conversion in accordance with the present invention is controlled by a programmable control logic circuit which provides accurate synchronization of data transfer throughout the device in a relatively simple manner. It is a particular advantage of the synchronous converter of FIG. 1 that when it is necessary to change the respective frequency or phase relationship of any of the signals, such change can be easily obtained without modification of the circuit elements.

As an example, the programmable counter 10, 20 and the programmable control circuit may be implemented by a programmable counter/timer input/output integrated circuit device, such as type Z8536, manufactured by Zilog Corporation, and the shift register 28 by an integrated circuit device, type 74LS165, manufactured by Texas Instruments among others. The above-indicated device is indicated in FIG. 1 by interrupted line and designated by reference numeral 37.

Figure 4:
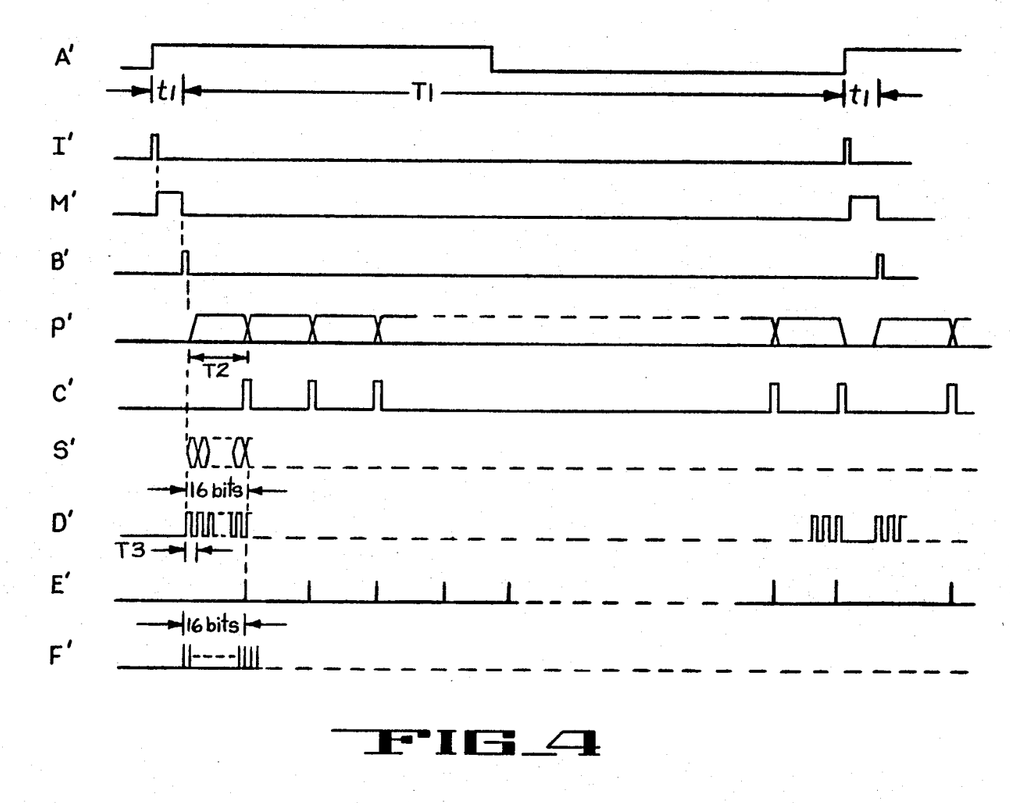
FIG. 4 shows timing diagrams illustrating operation of the circuit of FIG. 2.

Now the preferred embodiment of a time code generator utilizing a programmable parallel-to-serial converter as previously described with reference to FIG. 1 will be described in detail with reference to the schematic circuit diagram of FIG. 2 and the timing diagrams of FIG. 4.

Figure 2:
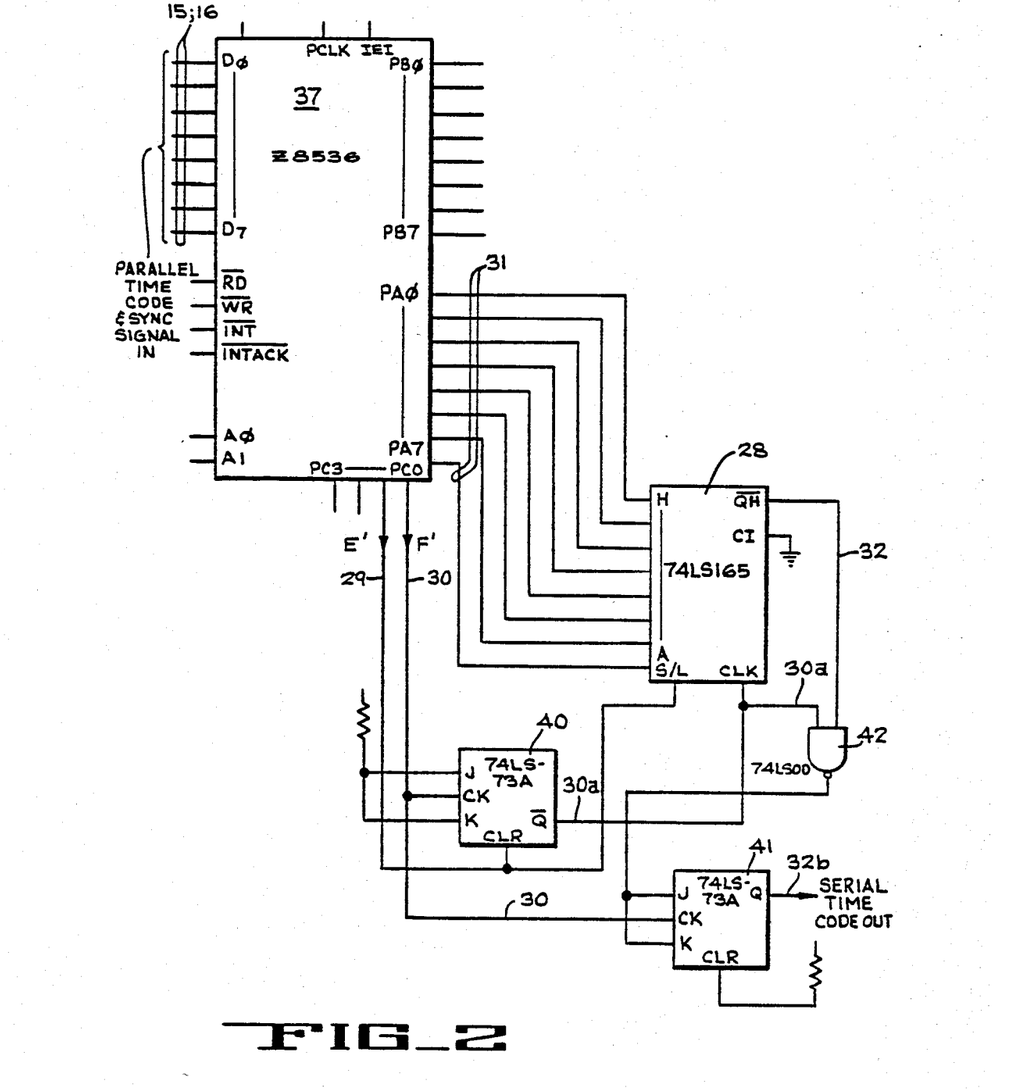
FIG. 2 is a detailed diagram of a preferred embodiment of a programmable longitudinal time code generator in accordance with the present invention utilizing the converter of FIG. 1.

In the embodiment of FIG. 2 a programmable counter/timer input/output device, further referred to as CTIO device 37 is utilized, preferably implemented by type Z8536 manufactured by Zilog Corporation. The above-indicated device 37 has three 16-bit programmable counter/timer circuits two of which are utilized as a first and a second counter 10, 20, respectively, similar to those previously described with respect to FIG. 1. The device 37 also includes a programmable control logic circuit such as circuit 14 of FIG. 1, a bidirectional data bus, two sets of 8-bit programmable input/output ports, and one 4-bit port shortly I/O ports, The time code is received on data bus 15 as a sequence of parallel bytes, for example from a well known time code generator, such as a microprocessor (not shown). One set 31 of 8-bit ports is programmed to apply the latter parallel input data to the previously described shift register 28 of FIG. 1.

It is noted that to facilitate comparison between the drawing FIGURES like elements are designated by like reference numerals.

Shift register 28 is preferably implemented in FIG. 2 as type 74LS165 manufactured among others by Texas Instruments.

As an example, the operation of the programmable time code generator of the preferred embodiment of FIG. 2 will be now described where an 80-bit time code is received by data bus 15 as a sequence of ten parallel bytes and it is applied as an 80-bit longitudinal time code on line 32 therefrom for recording on a magnetic tape synchronously with a video information signal, recorded for example by a rotary helical type recording device in a manner well known in the art. As it is well known the video frame rate in the NTSC and PAL-M systems approximately 60 frames/per second, while in PAL and SECAM systems it is 50 frame/per second. Consequently, the frequency at which the longitudinal time code is to be recorded in these various systems must change accordingly to obtain accurate timing and synchronization with the recorded information signal. The programmable time code generator of the invention has the advantage that it can be readily adapted to provide the necessary changes in frequency and in a predetermined delay of the time code without changing any circuit elements as it will follow.

As it is well known, in professional broadcast quality video recording the time code recorded on tape must satisfy well defined standard requirements. One requirement is a given predetermined delay, further referred to as t1, which is a time interval between a specified edge of the vertical sync pulse and the time when actual recording of a video information signal pertaining to the current frame starts. Consequently recording of the time code must be likewise delayed following each vertical sync pulse by a different value of t1 as specified for each recording system.

A further example of a change in recording parameters requiring a corresponding change of the frequency at which the time code is recorded on tape occurs when the recording takes place at a tape speed different from a normal playback speed. For example, when recording at twice the normal tape speed, the time code must be recorded at double frequency. Analogously, when for example the recording takes place at one-half of the normal playback speed, the longitudinal time code frequency must be reduced to one-half to obtain synchronization with the recorded information. It is an important advantage of the time code generator of the present invention that the above indicated changes in the delay and frequency of the longitudinal time code can be readily made without the need of providing relatively complicated timing and logic circuity as it has been the case in prior art time code generators.

The operation of the programmable time code generator of FIG. 2 will be described now with reference to flow diagrams of FIGS. 5A to 5C and the timing diagram of FIG. 4. It is noted that various signals which are comparable to those previously described with reference to FIG. 3 are indicated in FIG. 4 by like letter designations with a prime attached thereto while like signals and circuit elements are designated by like characters in all the drawing figures to facilitate comparison.

Figure 5A:
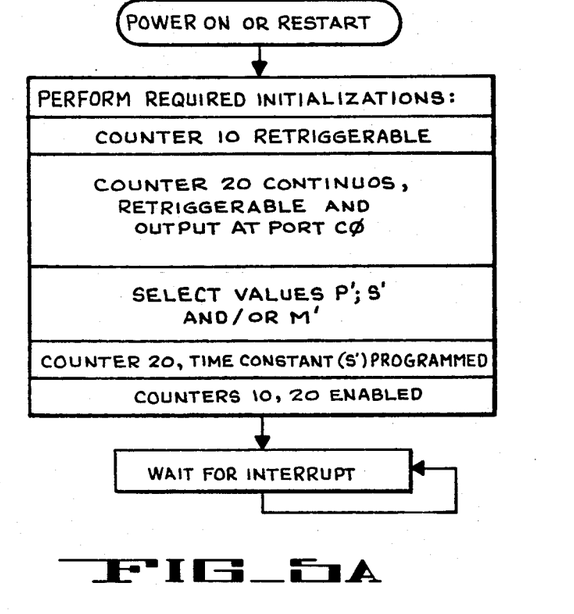
FIGS. 5A to 5C show simplified flow diagrams depicting the flow of operation of the circuit of FIG. 2.
Figure 5B:
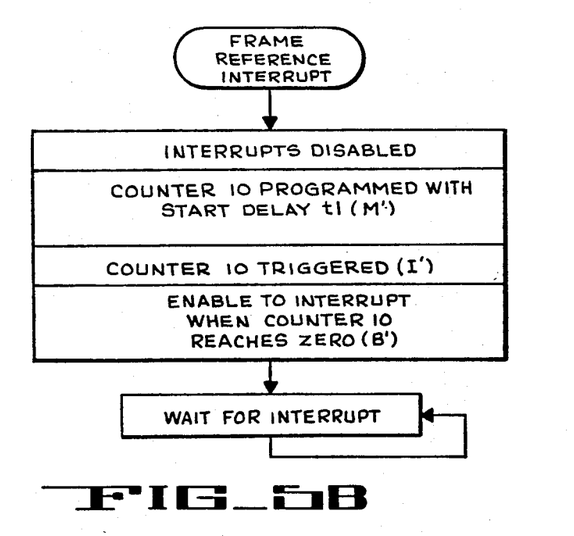
Figure 5C:
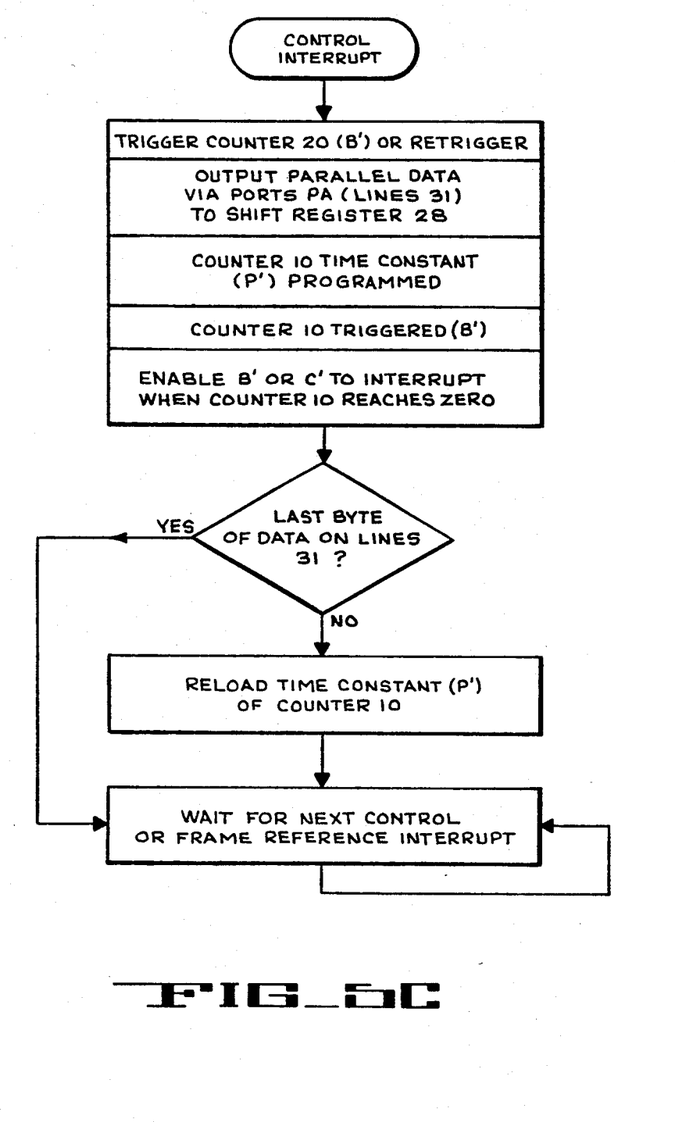

First an initialization or power-up of the programmable CTIO device 37 is provided as depicted in FIG. 5A. A first counter, selected as counter 2 of the device 37 and which is similar to the previously described counter 10 of FIG. 1 is programmed to be retriggerable. A second counter, selected as counter 3 of the device 37, which is similar to counter 20 of FIG. 1 is programmed to be continuous, retriggerable and having its output available through port C of the device 37, indicated as line 30 in FIG. 2. Both counters 10, 20 synchronously receive a 2 MHz clock signal obtained from a 4 MHz system clock generator and a frequency divide-by-two (not shown). The system clock generator corresponding to clock signal generator 27 of FIG. 1. Thereafter a time constant corresponding to a previously described binary number S is programmed for the second counter 20 as it will be specified later. Thereafter the counters 10, 20, and the ports and interrupts of the CTIO device 37 are enabled.

The following operation will be now described with reference to FIG. 5B.

Next, the CTIO device 37 is programmed to provide a start delay t1 every time after a vertical video frame synchronizing pulse A' is received. In the embodiment of FIG. 2 the signal A' is received as a parallel data byte via data bus 15 in a time shared manner with the parallel time code data. Signal A' and the start delay t1 are shown in the timing diagram of FIG. 4. Then counter 10 is triggered by a pulse I' and interrupts are enabled to interrupt the operation when counter 10 reaches zero. It will be understood from the foregoing description that the start delay t1 is obtained by loading into counter 10 for example a number M' whose value is selected to obtain the necessary delay t1 at the known clock frequency of counter 10. Thus when counter 10 counts down to zero a first interrupt signal B' is provided on line 24 by that counter as shown in FIG. 3.

The following operation is described with reference to FIG. 5C. In response to signal B' the CTIO device triggers the second programmable counter 20 and simultaneously the parallel data byte received at input ports 15 is applied via output ports 31 to a parallel input of the parallel-to-serial converter 28. Simultaneously the previously described binary number P' is programmed by the CTIO device 37 for the first counter 10, where P is a 16-th multiple of the number S as previously described, that is $P = 16 \times S$. Thereafter counter 10 is triggered by the previously described pulse B'. Counter 10 interrupt is enabled to allow retriggering counter 20 every time when a zero count is obtained by counter 10. The latter interrupt or control signal is shown in FIG. 4 at E'. The CTIO device is programmed to repeat the above-described operations of FIGS. 5A to 5C following the reception of each vertical sync signal A' on line 16.

In the preferred embodiment of FIG. 2 sixteen pulses D' are provided by counter 20 for reach pulse C' for the following reasons. The serial pulses of the longitudinal time code obtained on line 32 are in the return-to-zero or shortly RZ form. As well known in the art the latter type of signal cannot be easily recovered from tape because of its non-self-clocking format.

Consequently, it is necessary to convert these pulses from RZ to NRZ or non-return-to-zero format by obtaining an additional transition from high to low or low to high value in the middle of each bit cell corresponding to binary one as well known. To obtain the foregoing, the above-described respective signals D' and F' are provided by the circuit of FIG. 2 at twice the rate at which the serial output signal, that is the longitudinal time code on line 32 is applied from the shift register 28. The RZ to NRZ conversion is provided by flip-flops 40, 41 and NAND gate 42. Flip-flop 40 receives on line 30 from the CTIO device 37 signal F' at a frequency 16 times that of signal C'. Flip-flop 40 receives the latter signal and divides its frequency by two. The resulting signal is applied therefrom via line 30a to the parallel-to-serial shift register 28 as the serial clock signal. The above-mentioned signal F' on line 30 is also applied to the second flip-flop 41. The shift register 28 provides a serial output signal on line 32 at its serial clock frequency on line 30a which output signal corresponds to the longitudinal time code which however is in the form of an RZ signal. The signal on line 32 is then applied through a NAND gate 42 whose other input receives the serial clock signal on line 30a to the second flip-flop 41. Flip-flop 41 in turn provides a midcell transition for each serial pulse received on line 32a which has a binary value of one, the timing of that transition being determined by the signal F' on line 30. As a result a serial time code signal in the desired NRZ from is obtained on output line 32b from flip-flop 41 which output signal is synchronous with signal F' on line 30 and has one half of its frequency.

It will be understood from the foregoing disclosure that if it is desired to utilize the embodiment of FIGS. 1 or 2 to obtain serial output data at various selected frequency ratios with respect to a synchronizing signal or, alternatively, when it is necessary to change the frequency of the synchronizing signal received by these embodiments, or the delay t1, a plurality of parameters P; S or P'; S' and/or M' may be stored by the programmable control circuit. Selected ones of these parameters are then retrived by the control circuit to obtain the particular selected frequency ratios and/or delay.

Having described specific preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A programmable time code generator circuit receiving a time code signal in the form of parallel data and providing a longitudinal time code in serial data form to be recorded on a magnetic medium synchronously with an information signal having a synchronizing signal of a known frequency recorded therewith, comprising:

a programmable control means coupled to receive said synchronizing signal and to store a first and a second integral count, respectively;

a first programmable counter means coupled to said programmable control means to receive said stored first integral count therefrom in response to said synchronizing signal, said first counter means coupled to count at a known frequency to obtain a first time interval having a predetermined ratio with respect to a period of said synchronizing signal, said first counter means applying a first control signal to said programmable control means when said first time interval is obtained;

a second programmable counter means synchronous with said first counter means coupled to said programmable control means to receive in response to said first control signal said stored second integral count to obtain a second time interval having an integral number ratio with respect to said first time interval, said second counter responsively providing a second control signal when said second time interval is obtained; and a parallel-to-serial data converter means coupled to receive said time code signal in the form of parallel data having a known number of bits, synchronously with said first control signal and to provide a longitudinal time code signal in the form of serial data synchronously with said second control signal.

2. A programmable time code generator circuit receiving a time code signal in the form of parallel data and providing a longitudinal time code in serial data form to be recorded on magnetic tape synchronously with a composite video signal having a vertical frame synchronizing signal of a known frequency and a video information signal, said video information signal being provided in consecutive frames, each frame having a known delay with respect to said vertical frame synchronizing signal, comprising:

a programmable control means coupled to receive said vertical frame synchronizing signal and to store an initial, a first and a second integral count, respectively;

a first programmable counter means coupled to said control means to receive said stored initial integral count in response to said vertical frame synchronizing signal, said first counter means coupled to count at a known frequency to obtain said known delay and to apply an initial control signal to said control means when said known delay is obtained;

said programmable control means being further coupled to apply to said first programmable counter means said stored first integral count in response to said initial control signal to provide a first time interval having a predetermined ratio with respect to a period determined as a difference between a period of said synchronizing signal and said known delay, said first counter means applying a first control signal to said programmable control means when said first time interval is obtained;

a second programmable counter means synchronous with said first counter means coupled to said programmable control means to receive in response to both said initial and first control signal said stored second integral count to obtain a second time interval having an integral number ratio with respect to said first time interval, said second counter responsively providing a second control signal when said second time interval is obtained; and a parallel-to-serial data converter means coupled to receive said time code signal in the form of parallel data having a known number of bits, synchronously with said first control signal and to provide a longitudinal time code signal in the form of serial data synchronously with said second control signal.

3. The circuit of claim 2 wherein said parallel-to-serial data converter means provides said longitudinal time code signal in a return-to-zero format, further comprising a means coupled to receive and convert said signal into a non-return-to-zero format.

4. A synchronous programmable parallel-to-serial data converter circuit receiving consecutive parallel data words each having a known number of bits and a synchronizing signal having a known frequency for converting said parallel data words into serial data synchronous with said synchronization signal, comprising:

a programmable control means coupled to receive said synchronizing signal and store a first and second integral count, respectively;

a first programmable counter means coupled to said programmable control means to receive said stored first integral count synchronously with receiving said synchronizing signal, said first programmable counter means being coupled to count at a known frequency to obtain a first time interval having a predetermined ratio with respect to a period of said synchronizing signal, said first counter means applying a first control signal to said programmable control means when said first time interval is obtained;

a second programmable counter means synchronous with said first counter means and coupled to said programmable control means to receive synchronously with said first control signal said stored second integral count to obtain a second time interval having an integral number ratio with respect to said first time interval, said second counter means providing a second control signal when said second time interval is obtained; and a parallel-to-serial data converter means coupled to receive said parallel data words synchronously with said first control signal and to provide a serial output data synchronously with said second control signal.

* * * * *